United States Patent
Farnworth

[19]

[11] Patent Number: 6,072,324

[45] Date of Patent: *Jun. 6, 2000

[54] METHOD FOR TESTING SEMICONDUCTOR PACKAGES USING OXIDE PENETRATING TEST CONTACTS

[75] Inventor: Warren M. Farnworth, Nampa, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/617,680

[22] Filed: Mar. 19, 1996

[51] Int. Cl.⁷ .............................. G01R 1/073; G01R 31/02
[52] U.S. Cl. ............................................ 324/757; 324/755
[58] Field of Search .................................... 324/757, 754, 324/755, 537; 439/44, 65, 66, 74, 931

[56] References Cited

U.S. PATENT DOCUMENTS

| | | | |
|---|---|---|---|
| 3,596,228 | 7/1971 | Reed, Jr. et al. | 324/537 |
| 3,818,415 | 6/1974 | Evans et al. | |
| 4,770,907 | 9/1988 | Kimura | 437/217 |
| 5,083,697 | 1/1992 | DiFrancesco | 324/757 |
| 5,142,785 | 9/1992 | Grewall et al. | 30/32 |
| 5,143,523 | 9/1992 | Matarrese | 51/293 |
| 5,196,107 | 3/1993 | Nakaoka et al. | 205/110 |
| 5,209,613 | 5/1993 | Nishio | 407/119 |
| 5,430,614 | 7/1995 | DiFrancesco | 439/65 |
| 5,456,404 | 10/1995 | Robinette, Jr. et al. | 228/104 |
| 5,471,151 | 11/1995 | DiFrancesco | 324/757 |
| 5,527,591 | 6/1996 | Crotzer | 439/66 |
| 5,729,147 | 3/1998 | Schaff | 324/755 |

*Primary Examiner*—Ernest Karlsen
*Attorney, Agent, or Firm*—Stephen A. Gratton

[57] ABSTRACT

A method for testing semiconductor packages using oxide penetrating test contacts is provided. The test contacts are attached to a burn-in board and include a base metal formed in compliant shape. In addition, the test contacts include a conductive layer having an abrasive grain material embedded therein. The conductive layer and abrasive grain material are adapted to penetrate an oxide coating on the package leads to form a low resistance electrical contact. The abrasive grain material can be formed of diamond, synthetic diamond, diamond like carbon or cubic boron nitride. The conductive layer and abrasive grain material can be formed on the base metal using a process such as electro-deposition, chemical deposition, powder metallurgy or vapor deposition.

17 Claims, 2 Drawing Sheets

METHOD FOR TESTING SEMICONDUCTOR PACKAGES USING OXIDE PENETRATING TEST CONTACTS

FIELD OF THE INVENTION

This invention relates generally to semiconductor manufacture and more particularly to an improved method for testing semiconductor packages using oxide penetrating test contacts.

BACKGROUND OF THE INVENTION

Packaged semiconductor dice are tested several times during the manufacturing process. A probe test is conducted at the wafer level to test the gross functionality of the dice. Following singulation of the wafer and packaging of the individual dice, full functionality and burn-in tests are performed on the packaged dice. These tests are typically performed using testing apparatus that provide an electrical interface between the terminal leads on the package and external test circuitry.

For example, burn-in boards are adapted to hold a large number of packaged dice in a chamber with temperature cycling capability. The burn-in board includes electrical contacts that mate with the leads on the semiconductor packages to establish an electrical interconnection between the semiconductor dice and test circuitry. During the burn-in test the integrated circuits on the packaged dice are electrically tested at different temperatures.

One common semiconductor package for a single die is known as a small outline j-lead package (SOJ). A burn-in board for SOJ packages includes electrical test contacts that mate with the j-leads for the packages. Other standardized package lead configurations include gull wing, butt joint, integral standoff, pin grid array, ball grid array and land grid array. Standardized burn-in boards include test contacts for each of these types of package lead configurations.

One problem in making a temporary electrical connection to the leads on the semiconductor packages is caused by an oxide layer that forms on the surface of the package leads. The package leads are typically formed of a metal such as a nickel-iron alloy, a copper alloy or a copper clad stainless steel. Depending on the material, a metal oxide layer up to several hundred angstroms thick can form on the package leads. This oxide layer can result from environmental factors such as air and moisture.

In order to make a low resistance electrical connection with the package leads, the mating electrical contacts on the test apparatus can be constructed to scrub through the oxide layer and contact the underlying metal. This requires that the electrical contacts be configured for a lateral motion. This requirement can complicate the test apparatus and introduce additional process variables. In addition, the package leads can be damaged by the scrubbing motion.

Additionally, in order to make a low resistance electrical connection, the package leads are sometimes pressed against the electrical contacts on the test apparatus with a large contact force. In this case the package leads, or package, can be damaged by the force required to make the electrical connection. It would be advantageous to construct test contacts for semiconductor packages that do not require a large contact force or a scrubbing motion to make a low resistance electrical connection.

In view of the foregoing, it is an object of the present invention to provide an improved method for testing semiconductor packages using test contacts adapted to penetrate the oxide layer on the package leads with a minimal contact force. It is yet another object of the present invention to provide an improved test contact having an oxide penetrating conductive layer formed thereon. It is a still further object of the present invention to provide an improved method for forming a test contact with an oxide penetrating conductive layer. Other objects, advantages and capabilities of the present invention will become more apparent as the description proceeds.

SUMMARY OF THE INVENTION

In accordance with the present invention, a method for testing semiconductor packages using oxide penetrating test contacts is provided. The oxide penetrating test contacts are formed in a compliant shape and include a base layer and an external conductive layer having an abrasive grain material embedded therein. Suitable abrasive grain materials for the test contacts include diamond, synthetic diamond, diamond like carbon (DLC) and cubic boron nitride. The abrasive grain material and conductive layer can be formed on the test contacts using an electro-plating, chemical plating, powder metallurgy or vacuum deposition process.

The test contacts can be formed on a test apparatus such as a burn-in board for packaged semiconductor dice. The test contacts can be formed integrally with the test apparatus using an injection molding process. In an illustrative embodiment, the test contacts are formed as compliant spring segments. In addition, the test contacts can be formed with a shape for contacting standard lead configurations for semiconductor packages including: j-bend, gull wing, integral standoff, ball, pin or land package leads. During a test procedure, the package and package leads are pressed against the test contacts. This causes the conductive layers of the test contacts to penetrate an oxide coating on the package leads to form a conductive path from the package leads to external test circuitry.

DETAILED DESCRIPTION OF THE PREFERRED EMBODIMENT

Figure 1:
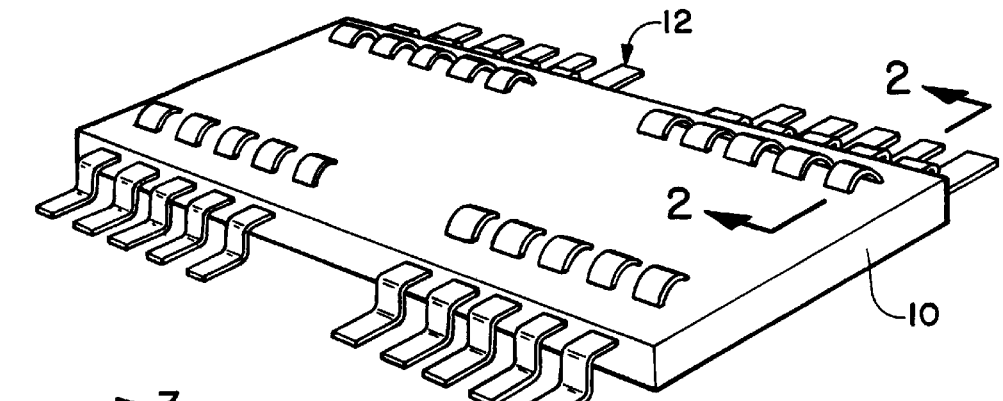
FIG. 1 is a schematic perspective view of a test apparatus having oxide penetrating test contacts constructed in accordance with the invention.

Referring to FIG. 1, a test apparatus 10 having oxide penetrating test contacts 12 constructed in accordance with the invention is shown. The test apparatus 10 is constructed as a burn-in board adapted to support a large number of semiconductor packages 14 (FIG. 4A) for testing. The test apparatus 10 is configured for insertion into a burn-in oven electrically connected to external test circuitry. The test apparatus 10 can be formed of an insulating material such as a glass filled plastic or a FR-4 material.

Figure 2:
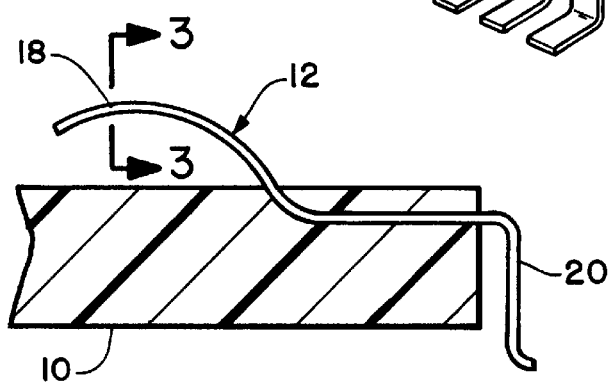
FIG. 2 is a cross sectional view of the test apparatus taken along section line 2—2 of FIG. 1.

The oxide penetrating test contacts 12 are adapted to contact the package leads 16 (FIG. 4A) and establish a temporary electrical connection between the package leads 16 and the external test circuitry (not shown). As shown in FIG. 2, in an illustrative embodiment the oxide penetrating test contacts 12 are formed with a compliant spring segment 18 and a terminal segment 20. The compliant spring segments 18 are adapted to contact the package leads 16 (FIG. 4A). The terminal segments 20 are adapted to contact the external test circuitry. The test contacts 12 can be formed separately and then attached to the test apparatus 10 using an injection molding process.

Figure 3:
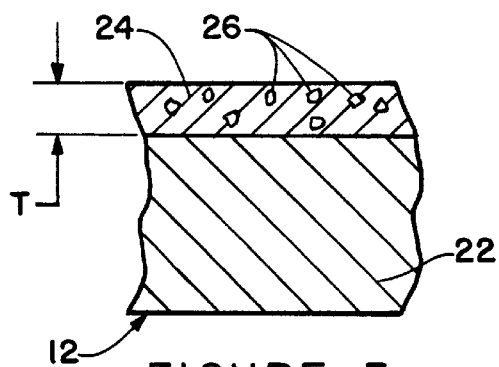
FIG. 3 is an enlarged schematic cross sectional view of a test contact taken along section line 3—3 of FIG. 2.

Referring to FIG. 3, further details of the construction of the test contacts 12 are shown. The test contacts 12 include a base layer 22 and a conductive layer 24. The base layer 22 is formed of a high tensile strength metal that can be shaped to form the compliant spring segment 18 (FIG. 2) and the terminal segment 20 (FIG. 2). Suitable materials for the base layer 22 of the test contacts 12 include copper alloys, stainless steel and nickel-iron alloys.

The conductive layer 24 is formed on the base layer 22 and includes an abrasive grain material 26 embedded therein. The abrasive grain material 26 can be formed of diamond, synthetic diamond, diamond-like carbon and cubic boron nitride. The conductive layer 24 and abrasive grain material 26 can be formed by electro-plating or chemically plating both materials onto the base layer 22 to a desired overall thickness "T".

A representative plating process can include the abrasive grain material 26 suspended in a plating solution such as a solution of nickel sulfate, nickel chloride and boric acid. For electro plating, a plating apparatus can include a tank for the plating solution and a power source electrically connected to an anode within the plating solution and to the base layer 22 for the test contact 12. U.S. Pat. No. 5,196,107, incorporated herein by reference, discloses a representative plating process for plating abrasive grains in a nickel matrix onto an underlying substrate. In the present case, the underlying substrate is the base layer 22 and the nickel matrix is the conductive layer 24.

The conductive layer 24 and abrasive grain material 26 can also be formed by conventional powder metallurgical techniques. In this case the conductive layer 24 is formed of a powdered metal pressed in a mold and then sintered. The abrasive grain material 26 is mixed with the powdered metal and both materials are press-molded to the base layer 22 of the test contact 12. A representative powder metallurgical process is disclosed in U.S. Pat. No. 5,209,613 incorporated herein by reference. In this case the conductive layer 24 can be a metal such as nickel, copper, tungsten, cobalt, iron, chromium, titanium or tantalum.

The conductive layer 24 and abrasive grain material 26 can also be formed using a vapor deposition process. U.S. Pat. No. 5,142,785, incorporated herein by reference, discloses a representative vapor deposition process in which an abrasive grain material such as diamond or diamond like carbon is deposited on a layer of molybdenum. Still further, the conductive layer 24 and abrasive grain material 26 can be formed as diamond coated metal clad pellets, as described in U.S. Pat. No. 5,143,523 incorporated herein by reference.

A representative thickness "T" of the conductive layer 24 can be from 0.25 mil to 7 mils. A representative size of the abrasive grain material 26 can be from 3 $\mu$m to 250 $\mu$m. The concentration of the abrasive grain material 26 as a proportion of the volume of the conductive layer 24 can be from 1 to 25%.

Figure 4B:
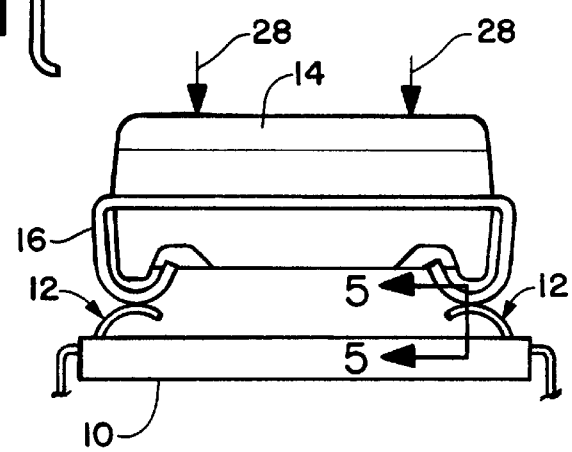
FIG. 4B is an end view of FIG. 4A.
Figure 4A:
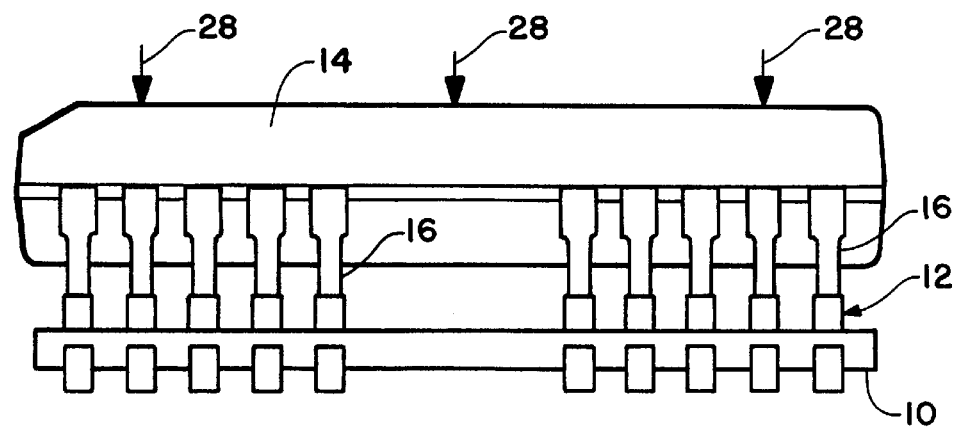
FIG. 4A is side elevation view of a semiconductor package being electrically tested in accordance with the method of the invention.

Referring to FIGS. 4A and 4B, the test apparatus 10 and oxide penetrating test contacts 12 are illustrated in the testing of the semiconductor package 14. During the test procedure the package leads 16 are placed in contact with the test contacts 12. The test contacts 12 are configured with a size and spacing that corresponds to the size and spacing of the package leads 16.

For example, with the semiconductor package 14 having a standard SOJ configuration, the package leads 16 are formed as j-bends with a minimum width of about 0.018 inches, on a pitch of about 0.048 to 0.052 inches and with a spacing between the center lines of the leads 16 on the opposite sides of the package 10 of about 0.260 to 0.275 inches. The test contacts 12 can be sized and spaced with corresponding dimensions to support the package 14 and package leads 16 substantially as shown in FIGS. 4A and 4B.

During the test procedure, the package 14 is pressed against the test contacts 12 as indicated by the force arrows 28. A conventional test handler (not shown) operatively associated with the test apparatus 10 can be used to press the package 14 and package leads 16 against the test contacts 12.

Because the test contacts 12 are formed with a compliant shape, z-direction dimensional variations in the location of the package leads 16 can be accommodated by flexure of the test contacts 12. In addition, as will be further explained, with the semiconductor package 14 pressed against the test contacts 12, the conductive layer 24 and abrasive grain material 26 on the test contacts 12 can penetrate any oxide coating on the package leads 16.

Figure 5:
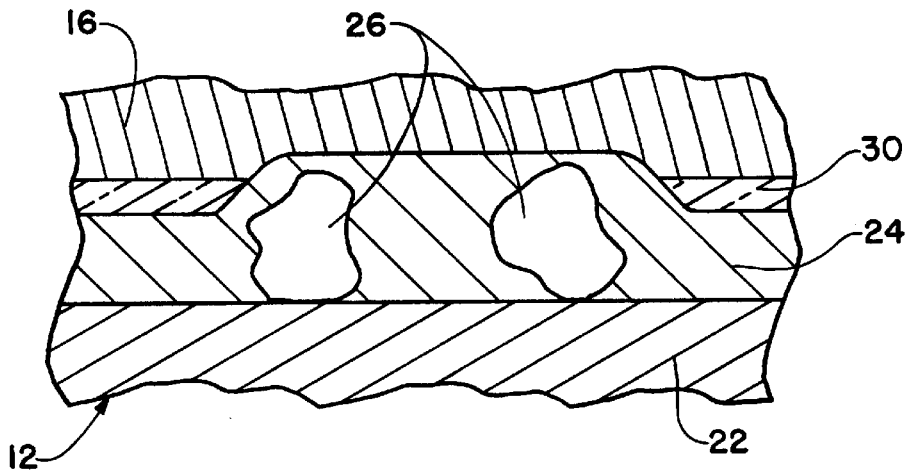
FIG. 5 is an enlarged schematic cross sectional view taken along section line 5—5 of FIG. 4B showing a conductive layer of the test contacts penetrating an oxide layer covering package leads.

Referring to FIG. 5, an enlarged schematic cross sectional view of the test contacts 12 and package leads 16 during testing of the semiconductor package 14 is shown. In this case, the package leads 16 are coated with a thin metal oxide layer 30. Such an oxide layer 30 will typically form as a result of environmental factors such as exposure to air and moisture. The oxide layer 30 can be only a few angstroms thick but tends to increase the resistance of the temporary electrical connection with the package leads 16.

The test contacts 16 are designed to penetrate such an oxide layer 30 to form a low resistance electrical connection. During a test procedure in accordance with the invention, the package leads 16 are pressed against the test contacts 12 as previously described. Under this pressure, the conductive layer 24 and abrasive grain material 26 penetrate through the oxide layer 30 and contact the underlying metal of the package leads 16. This forms a low resistance conductive path from the package leads 16, through the conductive layer 24, through the base layer 22 of the test contacts 12 and through the terminal segment 20 (FIG. 2) to external test circuitry.

Because of the penetrating function of the conductive layer 24, scrubbing of the test contacts 12 across the package leads 16 is not required. In addition, a smaller down force can be applied to the package 14 such that damage to the package 14 and leads 16 is minimized.

The test contact 12 configuration illustrated in FIGS. 1–4B is exemplary for an SOJ semiconductor package 14. However, the test contacts 12 can be configured to contact conventional lead configurations on other conventional semiconductor packages. Standard package lead configurations include gull wing, butt joint, integral standoff, pin grid, ball grid and land grid.

Figure 6A:
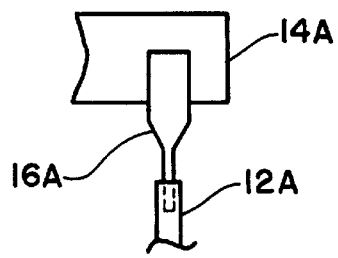
FIGS. 6A–6F are schematic side elevation views of different standard package lead configurations and test contacts constructed in accordance with the invention for contacting the leads.
Figure 6B:
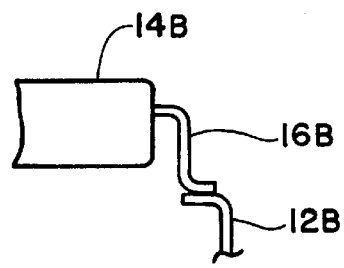
Figure 6D:
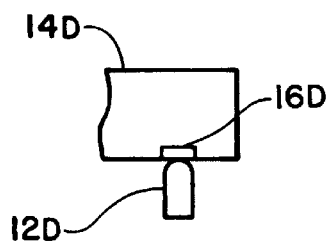
Figure 6C:
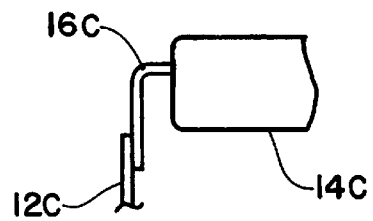
Figure 6E:
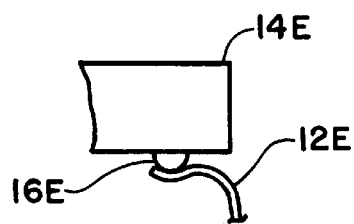
Figure 6F:
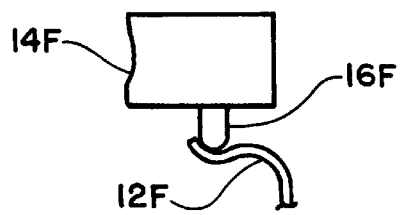

In FIG. 6A a semiconductor package 14A includes a standoff package lead 16A being contacted by a test contact 12A formed as a standoff contact member. In FIG. 6B a semiconductor package 14B includes a gull wing lead 16B being contacted by a test contact formed as a 90° spring segment. In FIG. 6C a semiconductor package 14C includes a butt joint lead 16C being contacted by a test contact 12C formed as a butt joint contact member. In FIG. 6D a semiconductor package 14D with a land grid pad 16D is being contacted by a test contact 12D formed as a spring loaded pin. In FIG. 6E a semiconductor package 14E with a ball grid pad 16E is being contacted by a test contact 12E formed with a hemispherical depression. In FIG. 6F, a semiconductor package 14F with a pin grid pad 16F is being contacted by a test contact 12F with a concave depression.

Thus the invention provides an improved method for testing semiconductor packages, an improved method for forming test contacts for semiconductor packages and an improved test contact for semiconductor packages. While the invention has been described with reference to certain preferred embodiments, as will be apparent to those skilled in the art, certain changes and modifications can be made without departing from the scope of the invention as defined by the following claims.

What is claimed is:

1. A test apparatus for testing a semiconductor package having a plurality of package leads comprising:
   a board; and
   a plurality of test contacts on the board configured to electrically engage the package leads, the test contacts comprising base metal layers comprising a high tensile strength metal shaped as compliant spring segments and conductive layers formed on the base metal layers, the conductive layers including an abrasive grain material embedded therein, the spring segments configured to press portions of the conductive layers and the abrasive grain material into the package leads for penetrating oxide layers on the package leads.

2. The test apparatus of claim 1 wherein the package leads comprise balls, and the test contacts comprise depressions configured to retain the balls as the conductive layers and the abrasive grain material are pressed into the balls.

3. The test apparatus of claim 1 wherein the abrasive grain material comprises diamond.

4. The test apparatus of claim 1 wherein the abrasive grain material has a size of from 3 μm to 250 μm.

5. The test apparatus of claim 1 wherein the base metal layers comprise a metal selected from the group consisting of copper alloys, stainless steel and nickel-iron alloys.

6. The test apparatus of claim 1 wherein the conductive layers comprise a material selected from the group consisting of nickel, copper, tungsten, cobalt, iron, chromium, titanium, tantalum and molybdenum.

7. The test apparatus of claim 1 wherein the board comprises plastic and the test contacts are embedded in the plastic.

8. A test apparatus for testing a semiconductor package having a plurality of package leads comprising:
   a board; and
   a plurality of test contacts on the board configured to electrically contact the package leads;
   the test contacts comprising:
      base metal layers comprising a high tensile strength metal shaped as spring segments;
      conductive layers on the base metal layers; and
      an abrasive grain material embedded in the base metal layers;
      the spring segments configured to press the abrasive grain material and portions of the conductive layers into the package leads to penetrate oxide layers thereon.

9. The test apparatus of claim 8 wherein the package leads comprise balls, and the test contacts comprise depressions configured to retain the balls as the portions of the conductive layers and the abrasive grain material are pressed into the balls.

10. The test apparatus of claim 8 wherein the board comprises a material selected from the group consisting of glass filled plastic and FR-4.

11. The test apparatus of claim 8 wherein the base metal layers comprises a metal selected from the group consisting of copper alloys, stainless steel and nickel-iron alloys.

12. The test apparatus of claim 8 wherein the abrasive grain material comprises diamond.

13. A test apparatus for testing a semiconductor package comprising a plurality of ball leads comprising:
   a board; and
   a plurality of test contacts on the board, each test contact comprising:
      a depression configured to electrically engage and retain a ball lead,
      a base metal layer comprising a high tensile strength metal shaped as a compliant spring segment;
      a conductive layer on the base metal layer; and
      an abrasive grain material embedded within the base metal layer;
      the spring segment configured to press portions of the conductive layer and the abrasive grain material into the ball lead, as the ball lead is retained in the depression.

14. The test apparatus of claim 13 wherein the depression has a substantially hemispherical shape.

15. The test apparatus of claim 13 wherein the grain material comprises diamond.

16. The test apparatus of claim 13 wherein the grain material has a size of from 3 μm to 250 μm.

17. The test apparatus of claim 13 wherein the ball leads are configured in a grid pattern.

* * * * *